(12) United States Patent
Houben

(10) Patent No.: US 8,619,258 B2
(45) Date of Patent: Dec. 31, 2013

(54) LITHOGRAPHIC APPARATUS AND DEVICE MANUFACTURING METHOD

(75) Inventor: Martijn Houben, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 301 days.

(21) Appl. No.: 12/632,160

(22) Filed: Dec. 7, 2009

(65) Prior Publication Data

US 2010/0143832 A1 Jun. 10, 2010

Related U.S. Application Data

(60) Provisional application No. 61/193,598, filed on Dec. 9, 2008.

(51) Int. Cl.
*G01N 21/55* (2006.01)

(52) U.S. Cl.
USPC ........... 356/445; 356/614; 356/625; 430/322; 355/53; 355/69; 355/72

(58) Field of Classification Search
USPC ........ 356/445, 614, 625, 432; 355/69, 30, 53; 430/322
See application file for complete search history.

(56) References Cited

U.S. PATENT DOCUMENTS

| | | | |
|---|---|---|---|
| 4,509,852 | A | 4/1985 | Tabarelli et al. |
| 7,199,858 | B2 | 4/2007 | Lof et al. |
| 7,230,681 | B2 | 6/2007 | Holmes et al. |
| 2002/0057423 | A1 | 5/2002 | Nogawa ........................ 355/30 |
| 2004/0136494 | A1 | 7/2004 | Lof et al. |
| 2004/0207824 | A1 | 10/2004 | Lof et al. |
| 2004/0211920 | A1 | 10/2004 | Derksen et al. |
| 2006/0038968 | A1 | 2/2006 | Kemper et al. |
| 2006/0119809 | A1 | 6/2006 | Verhagen et al. |

(Continued)

FOREIGN PATENT DOCUMENTS

| | | |
|---|---|---|
| EP | 1 420 300 A2 | 5/2004 |
| EP | 1 429 188 A2 | 6/2004 |

(Continued)

OTHER PUBLICATIONS

Partial Search Report as issued for European Patent Application No. 09176506.5, dated Mar. 26, 2010.

(Continued)

*Primary Examiner* — Gregory J Toatley
*Assistant Examiner* — Isiaka Akanbi
(74) *Attorney, Agent, or Firm* — Pillsbury Winthrop Shaw Pittman LLP

(57) ABSTRACT

In an immersion lithographic apparatus, bubble formation in immersion liquid is reduced or prevented by reducing a gap size or area on a substrate table. The gap size is reduced using an edge member which may be, for example, a ring known as a BES (Bubble Extraction System) ring. Information regarding the shape and/or cross-sectional dimension (e.g., diameter) of the substrate, or information regarding the size of the gap, is transmitted to a controller that controls the edge member in order for the edge member, for example, to be reduced to an appropriate size to reduce the gap as much as possible, desirably without compressing the edge of the substrate. Alternatively or additionally, the gap may be reduced by moving the substrate and/or edge member adjacent the edge of a surface of the substrate table.

20 Claims, 9 Drawing Sheets

(56) References Cited

U.S. PATENT DOCUMENTS

| | | |
|---|---|---|
| 2006/0119818 A1 | 6/2006 | Nagasaka |
| 2006/0126038 A1 | 6/2006 | Hoogendam et al. |
| 2006/0139614 A1* | 6/2006 | Owa et al. ............... 355/72 |
| 2006/0158626 A1* | 7/2006 | Baselmans et al. ......... 355/53 |
| 2006/0158632 A1* | 7/2006 | Yasuda et al. ............ 355/55 |
| 2006/0290908 A1* | 12/2006 | De Graaf et al. ......... 355/53 |
| 2007/0188731 A1 | 8/2007 | Bezama et al. |
| 2007/0229789 A1* | 10/2007 | Kawamura ............... 355/53 |
| 2008/0013089 A1 | 1/2008 | Ishii et al. |
| 2008/0212046 A1 | 9/2008 | Riepen et al. |

FOREIGN PATENT DOCUMENTS

| | | |
|---|---|---|
| EP | 1 641 028 | 3/2006 |
| EP | 1 713 113 A1 | 10/2006 |
| EP | 1 821 336 | 8/2007 |
| KR | 10-2006-0016812 | 2/2006 |
| KR | 10-2007-0085211 | 8/2007 |
| WO | WO 99/49504 A1 | 9/1999 |
| WO | WO 2005/010611 A2 | 2/2005 |
| WO | WO 2005/064405 A2 | 7/2005 |

OTHER PUBLICATIONS

Korean Office Action dated Apr. 14, 2011 in corresponding Korean Patent Application No. 10-2009-0121878

Taiwan Office Action mailed Apr. 12, 2013 in corresponding Taiwan Patent Application No. 098141908.

U.S. Appl. No. 61/071,621, filed May 8, 2008, Direcks et al.

U.S. Appl. No. 61/136,380, filed Sep. 2, 2008, Tanasa et al.

* cited by examiner

Fig. 2
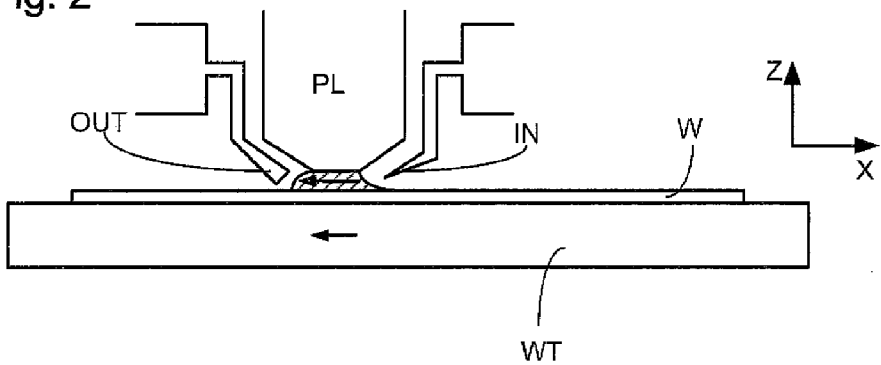
Fig. 3
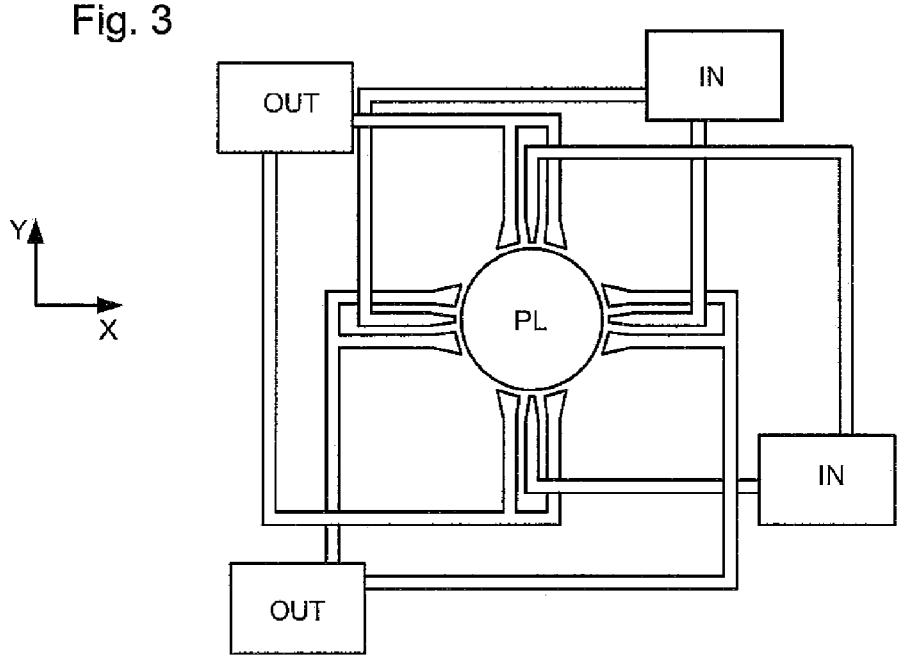
Fig. 4
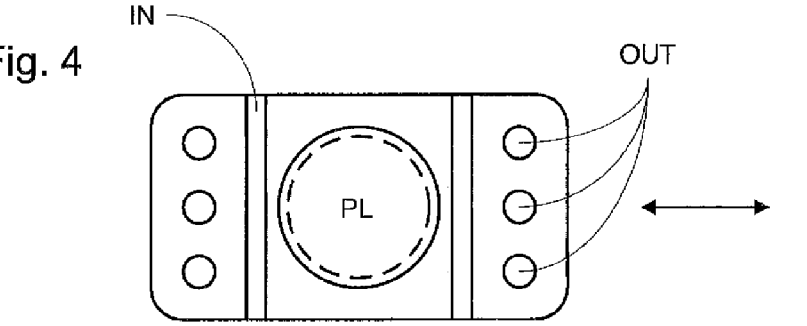
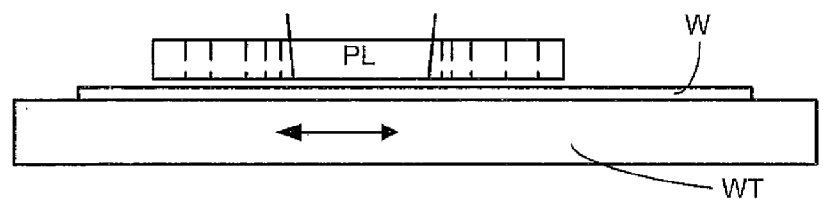

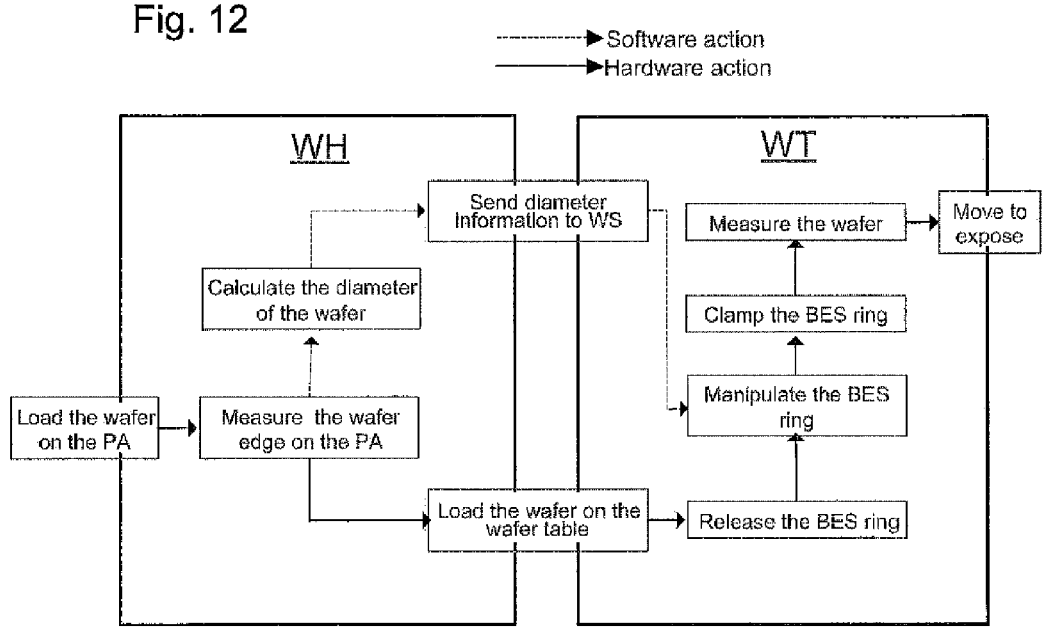
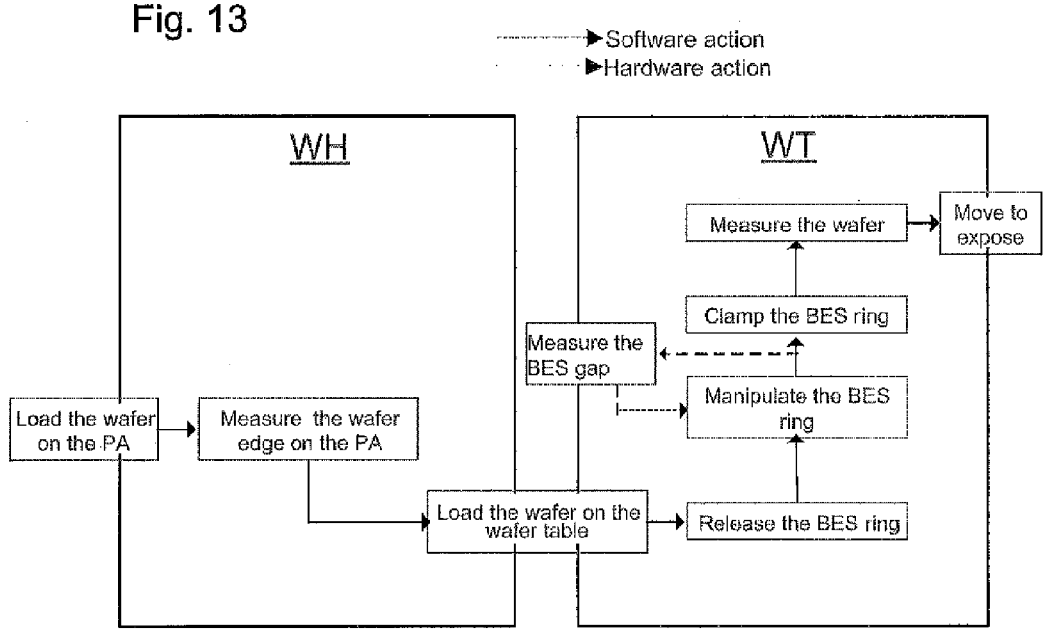

LITHOGRAPHIC APPARATUS AND DEVICE MANUFACTURING METHOD

This application claims priority and benefit under 35 U.S.C. §119(e) to U.S. Provisional Patent Application No. 61/193,598, entitled "Lithographic Apparatus and Device Manufacturing Method", filed on Dec. 9, 2008. The content of that application is incorporated herein in its entirety by reference.

FIELD

The present invention relates to a lithographic apparatus and a method for manufacturing a device, and in particular, a method and apparatus for positioning a device for exposure.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment, the fluid handling system may supply immersion fluid and may therefore be a fluid supply system. In an embodiment, the fluid handling system may at least partly confine immersion fluid and thereby be a fluid confinement system. In an embodiment, the fluid handling system may provide a barrier to immersion fluid and thereby be a barrier member, such as a fluid confinement structure. In an embodiment, the fluid handling system may create or use a flow of gas, for example to help in controlling the flow and/or the position of the immersion fluid. The flow of gas may form a seal to confine the immersion fluid and so the fluid handling structure may be referred to as a seal member; such a seal member may be a fluid confinement structure. In an embodiment, immersion liquid is used as the immersion fluid. In that case, the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way that has been proposed to arrange for this is disclosed in PCT patent application publication WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible. One example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate in which is defined a hole, which may be in its center, and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another arrangement which has been proposed is to provide the liquid supply system 12 with a barrier member which extends along at least a part of a boundary of the space between the final element of the projection system and the substrate table, as depicted in FIG. 5. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal 16. Such a system with a gas seal is disclosed in U.S. Patent Application Publication No. 2004/0207824 as well as European Patent Application Publication No. EP 1 429 188 and U.S. Patent Application Publication No. 2004/0211920.

In European Patent Application Publication No, EP 1 420 300 and United States Patent Application No. 2004/0136494, the idea of a twin or dual stage immersion lithography apparatus is disclosed. Such an apparatus is provided with two tables or stages for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

PCT patent application publication WO 2005/064405 discloses an "all wet" arrangement in which the immersion liquid is unconfined. In such a system, the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. 2006/0119809. A member is provided which covers the substrate in all positions and which is arranged to have immersion liquid extending between it and the top surface of the substrate and/or substrate table which holds the substrate.

A problem in immersion lithography is the occurrence of a bubble in the immersion liquid. If the path of the patterned beam passes through a region or volume of immersion liquid that contains a bubble, this may deleteriously affect the quality of the pattern image projected onto the substrate. For example, the imaged pattern may contain consequential defects. The presence of a bubble in the immersion liquid, particularly in the immersion space, is to be avoided.

There may be a recess formed in a surface opposing the liquid confinement structure. For example, a recess may exist in a substrate table or between a substrate and the substrate table, or even between the substrate table and a sensor, swap bridge, closing disc or measurement stage that is positioned in or next to the substrate table. The recess may be a groove which may function as a gutter. The recess may be configured to remove excess immersion liquid from the surface opposing the liquid confinement structure. The recess may trap gas when the substrate table moves relative to the liquid confinement structure or radiation system. The recess may cause liquid to escape from the immersion space (into the recess), resulting in an overall drop in liquid level in the immersion space. A drop in immersion liquid level could be a source of a bubble inclusion in the immersion space. Fluid behavior in the region of the recess may cause a bubble and/or a droplet to form. The droplet may cause a bubble to form in the immersion space. The droplet may apply a heat load onto a surface onto which it lands, for example the surface of a substrate or substrate table. The bubble or droplet may therefore cause deterioration, for example, in lithographic imaging performance.

SUMMARY

It is desirable, for example, to reduce the risk of creation of a bubble in the immersion liquid through which a beam passes. It is desirable to reduce the movement of the immersion liquid (e.g. water) or gas (e.g. air) in and out of the gap surrounding an object (e.g., a substrate) without applying pressure to an edge of the object sufficient to risk the deformation, such as curling, of the object.

Accordingly, there may be provided a method of reducing a gap between a substrate and a substrate table in an immersion lithographic apparatus, the method comprising:

measuring a physical property of the substrate; and reducing a gap defined between an edge of the substrate and an edge of a surface of a substrate table, the substrate table supporting the substrate in the immersion lithographic apparatus, the gap being reduced based on the measured physical property of the substrate.

There may be provided a method of reducing a gap between a substrate and a substrate table in an immersion lithographic apparatus, the method comprising:

measuring a gap defined between an edge of the substrate and an edge of a surface of a substrate table, the substrate table supporting the substrate in the immersion lithographic apparatus; and reducing the gap based on the measurement There may be provided a device manufacturing method comprising:

loading a substrate onto a pre-aligner;

measuring a physical property of the substrate at the pre-aligner;

loading the substrate from the pre-aligner onto the substrate table;

reducing a gap between an edge of the substrate and an edge of a surface of the substrate table based on the measured physical property; and exposing the substrate with patterned radiation.

According to an aspect of the invention, there may be provided a device manufacturing method comprising:

loading a substrate into a space defined by an edge of a surface of a substrate table, a gap being defined between the edge of the surface of the substrate table and an edge of the substrate;

measuring a physical property of the substrate in the substrate table and a size of the gap;

reducing the gap between the edge of the substrate and the edge of the surface of the substrate table using a gap-reducing mechanism based on the measured physical property of the substrate and the measured size of the gap; and exposing the substrate with patterned radiation.

There may be provided a lithographic projection apparatus comprising:

a pre-aligner including a measurement mechanism configured to measure a physical property of a substrate;

a substrate table configured to support the substrate in a space defined by an edge of a surface of the substrate table; and a gap-reducing mechanism configured to reduce a gap defined between an edge of the substrate and the edge of the surface of the substrate table based on information regarding the measured physical property of the substrate.

There may be provided a lithographic projection apparatus comprising:

a substrate table configured to support a substrate in a space defined by an edge of a surface of the substrate table so as to define a gap between the edge of the surface of the substrate table and an edge of the substrate;

a measurement mechanism configured to measure a physical property of the substrate and a size of the gap; and a gap-reducing mechanism configured to reduce the gap between the edge of the substrate and the edge of the substrate table based on the measurement by the measurement mechanism.

There may be provided a lithographic tool comprising a lithographic projection apparatus as described above.

There may further be provided a method of three-dimensional profiling of an edge of a planar substrate in an immersion lithographic or metrology apparatus, the method comprising: measuring a physical property of the substrate in the plane of the substrate and in a direction perpendicular to the plane of the substrate.

There may be provided an apparatus for a metrology tool or a lithographic projection apparatus, the apparatus comprising: a pre-aligner including a measurement mechanism configured to measure a physical property of an edge of a planar substrate in order to determine the three-dimensional profile of the edge.

There may further be provided an apparatus for a metrology tool or a lithographic projection apparatus, the apparatus comprising:

a substrate table configured to support a substrate in a space defined by an edge of a surface of the substrate table so as to define a gap between the edge of the surface of the substrate table and an edge of the substrate; and a measurement mechanism configured to measure a physical property of the substrate and a size of the gap, the measurement mechanism configured to measure a physical property of an edge of the substrate so as to determine the three-dimensional profile of the edge.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

FIG. 12 depicts a flow chart of a method according to an embodiment of the invention;

FIG. 13 depicts a flow chart of a method according to an embodiment of the invention;

DETAILED DESCRIPTION

Figure 1:
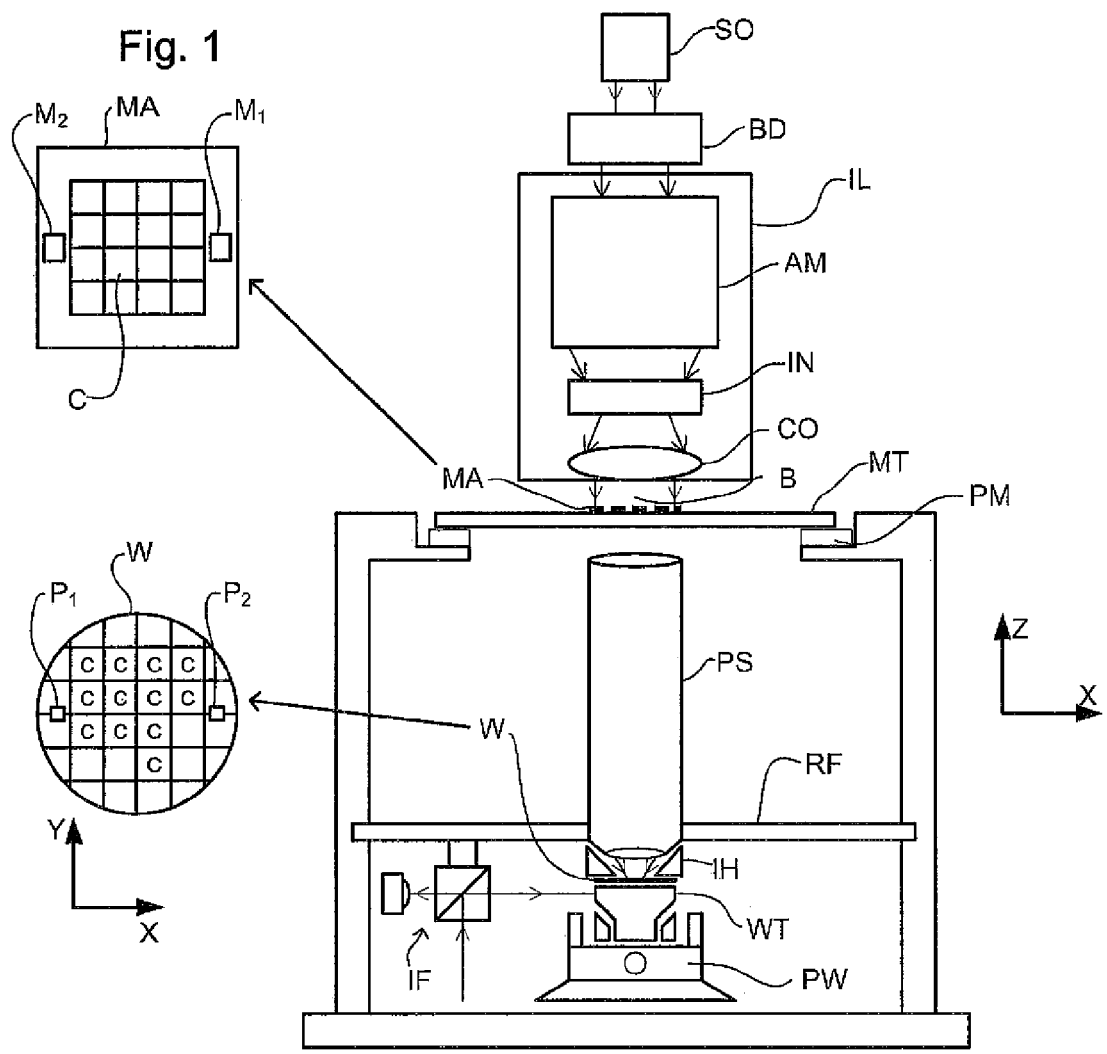
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table or a substrate table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into at least two general categories. These are: 1) the bath-type (or submersed) arrangement in which substantially the whole of the substrate W and optionally part of the substrate table WT is submersed in a liquid, such as in a bath or under a film of liquid; and 2) the so-called localized immersion system which uses a liquid supply system in which liquid is only provided to a localized area of the substrate. In the latter category, the space filled by liquid is smaller in plan than the top surface of the substrate. The volume of liquid in the space that covers the substrate remains substantially stationary relative to the projection system while the substrate moves underneath that space.

A further arrangement, to which an embodiment of the present invention is directed, is the all-wet solution in which the liquid is unconfined. In this arrangement, substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system. However, sealing features are not present in the liquid supply device, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 are described above.

Figure 5:
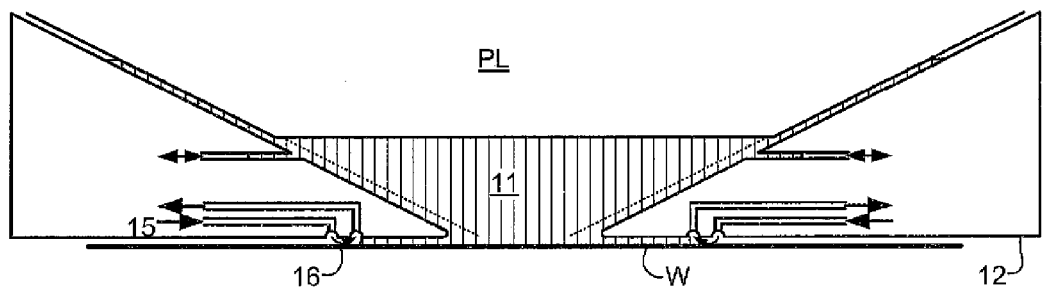
FIG. 5 depicts a further liquid supply system for use in a lithographic projection apparatus.

FIG. 5 schematically depicts a localized liquid supply system or fluid handling structure with a barrier member or fluid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid confinement structure 12 is substantially stationary relative to the projection system in the XY plane though there may be some relative movement in the Z direction (in the direction of the optical axis). In an embodiment, a seal is formed between the fluid confinement structure and the surface of the substrate W and may be a contactless seal such as a gas seal or fluid seal.

The fluid confinement structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid confinement structure 12 positioned below and surrounding the final element of the projection system PS. Liquid is brought into the space below the projection system and within the fluid confinement structure 12 by liquid inlet 13. The liquid may be removed by liquid outlet 13. The fluid confinement structure 12 may extend a little above the final element of the projection system. The liquid level rises above the final element so that a buffer of liquid is provided. In an embodiment, the fluid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the fluid confinement structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. 2004-0207824.

An embodiment of the present invention may be applied to any type of fluid handling system used in an immersion apparatus. The example of FIG. 5 is a so-called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no 2006-0038968. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 μm. In an embodiment, the porous material is at least slightly liquidphilic (e.g., hydrophilic), i.e. having a contact angle of less than 90° to the immersion liquid, e.g. water. In an embodiment, the liquid handling system may have an opening, such as an outlet, covered with a porous member.

Another arrangement which is possible is one which works by extracting two phase fluid and may be referred to as a gas drag principle. The so-called gas drag principle has been described, for example, in United States patent application publication no. 2008-0212046 and U.S. patent application no. U.S. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan.

An embodiment of the invention may be applied to a fluid handling structure used in an all wet immersion apparatus. In the all wet embodiment, fluid is allowed to cover substantially the whole of the top surface of the substrate table, for example, by allowing liquid to leak out of a confinement structure which confines liquid to between the final element of projection system and the substrate. An example of a fluid handling structure for an all wet embodiment can be found in U.S. patent application no. U.S. 61/136,380 filed on 2 Sep. 2008.

Figure 6:
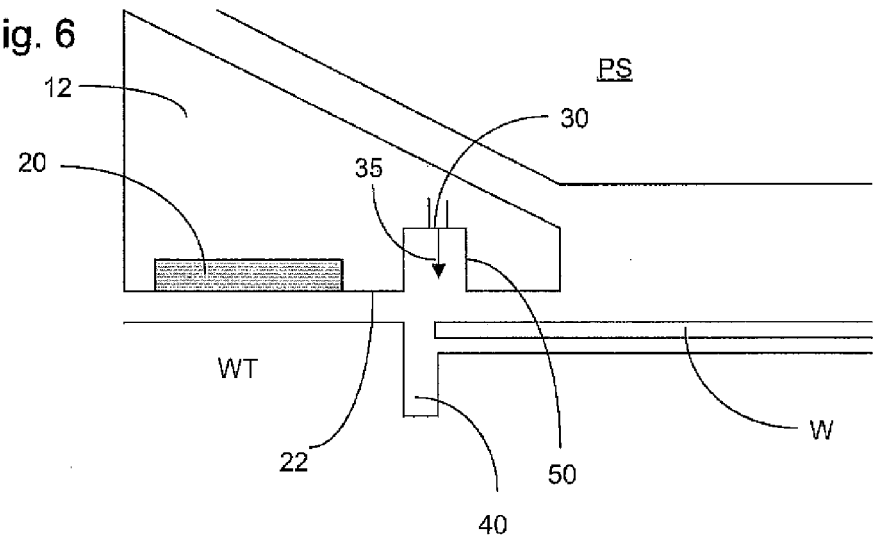
FIG. 6 is a schematic illustration, in cross-section, of a fluid handling system according to an embodiment of the present invention.

FIG. 6 illustrates schematically, in cross-section, a fluid handling system 12. The fluid handling system 12 at least partly confines immersion liquid to an immersion space 11 between the projection system PS and the substrate W. The fluid handling system 12 can provide liquid to the immersion space 11. However, for simplicity, openings (e.g., inlets and/ or outlets) for liquid supply into and/or removal out of the immersion space 11 are not illustrated. The openings may be any suitable type and configuration, for example those described with reference to the single phase extractor, the porous plate, gas-drag and all-wet embodiments described herein. If the fluid handling system 12 is of the type used to confine immersion liquid to a localized area, one or more sealing features 20 may be present on an undersurface 22 of the fluid confinement structure 12. The sealing feature 20 may be of any type, for example a gas seal, a gas knife, a liquid extraction, and/or a meniscus pinning feature. The meniscus pinning feature may have a point which is configured to secure a liquid meniscus. The undersurface 22 faces the substrate and/or substrate table WT during use. The undersurface 22 may be substantially parallel to the top surface of the substrate table WT and/or substrate W. The sealing feature 20 may not be present or may be less efficient or may be deactivated, for example in an all wet embodiment.

At least one opening 30 is present in the fluid handling system 12. The opening 30 is configured in use to direct a fluid flow towards the substrate table WT or substrate W. The opening 30 is used to provide liquid in the direction of arrow 35. The opening 30 may be configured and positioned in a surface of the fluid handling structure to direct a flow of liquid substantially perpendicular to the top surface of the substrate table and/or substrate. The opening may be defined in the surface 22 which may be substantially parallel to the top surface of the substrate table WT and/or substrate W.

A bubble may form when the fluid handling system 12 passes over a gap 40 (or G) between the substrate table WT and the edge of the substrate W (e.g., the gap 40, G moves under the fluid handling system 12 and/or the fluid handling system 12 moves over the gap 40, G). Providing fluid out of an outlet 30 in direction 35 can be beneficial in preventing bubble formation when the fluid handling system 12 passes over the gap 40 (or G).

A bubble may be present in the immersion liquid for a number of reasons. For example, a bubble may be formed by gas that remains in an immersion space when the immersion space is filled with liquid (i.e. gas remained when liquid displaced the rest of the gas that was previously in the immersion space).

In a further example, a macroscopic feature such as a contaminant or particle may prevent filling of the immersion space within the time it takes for the substrate to pass across the liquid confinement structure (i.e. within a single scan movement). This may result in gas becoming trapped in the immersion space. The surface tension of the meniscus formed between the liquid and the trapped gas volume pulls the trapped gas volume into a bubble shape in the immersion liquid. The bubble may float into the volume of the projected radiation if its buoyancy exceeds the surface tension holding the gas bubble to a surface defining the immersion space. Alternatively or additionally, the presence of a gap or hole in a surface of the immersion space (especially if the gap is of an appropriate size) may act as a trap that retains a bubble of gas even when the immersion space is immersed in liquid. Such a gap or hole may, for example, be present in the surface of the substrate table, around the edge of the substrate. The gap or hole may alternatively or additionally be around another object on the substrate table. The gap or hole may alternatively or additionally be between the substrate table and another structure such as a swap bridge (that swaps substrates between substrate tables), a closing disc, another portion of a lithographic apparatus or a metrology apparatus, or another portion of a lithography process tool (e.g. a bake plate or other structure intended to support the substrate at various times during its pre- and post-exposure development).

A rough surface may also prevent the filling of the immersion space, such as by capillary action, but on a microscopic scale. The immersion liquid contacts the protrusions of a rough surface, but it might not fully wet the contours of the surface. The extent of the roughness of the surface is proportional to the force caused by the surface tension; so a gas bubble may be trapped on such a surface more easily, for example, near a protrusion of the rough surface. The "effective contact angle" (e.g. the effective dynamic contact angle when a body of liquid is advancing relative to a surface) of a liquid volume passing over a rough surface varies more than when the liquid volume passes over a smooth surface. Thus, gas is more likely to be trapped where the contact angle is decreasing, that is, where the distal part of a protrusion on the rough surface meets the "front" of the advancing liquid volume before the proximal part of the projection. In this way, a volume of gas may be trapped at the upstream proximal part of the projection.

A bubble may form spontaneously because of a change in temperature or energy or other factors. Alternatively or additionally, gas (e.g., air) may be sucked into the system if the pressure of the system falls, e.g. with a fall in temperature. A resist, topcoat, or other chemical used on the surface of substrate may react (e.g. causing foaming) with the immersion liquid or radiation or both, causing a change in energy state, which may be detected as a change in temperature. A gas bubble may thereby be chemically created.

An example in which gas might not be replaced by liquid is depicted in FIGS. 5 to 8. Between a substrate W and a substrate table WT, there may exist a gap G (or 40) that fills with liquid 11 as the gap passes under the liquid confinement structure 12. A fluid flow source 15, 20 or 30, such as a gas knife, may direct a fluid flow, e.g. gas flow, towards a surface that may be co-planar with the substrate and the substrate table. The fluid flow, e.g., fluid flow 35, caused by the fluid flow source serves to clear the path of liquid for the liquid confinement structure 12. The liquid may be in the form of a droplet D or a liquid film. Reference in the following description to a droplet includes reference to a liquid film. Alternatively or additionally, the fluid source may supply a liquid flow from an opening in the liquid confinement structure to supply liquid between the undersurface of the liquid confinement structure and an opposing surface, i.e. a substrate W or a substrate table WT.

Figure 8:
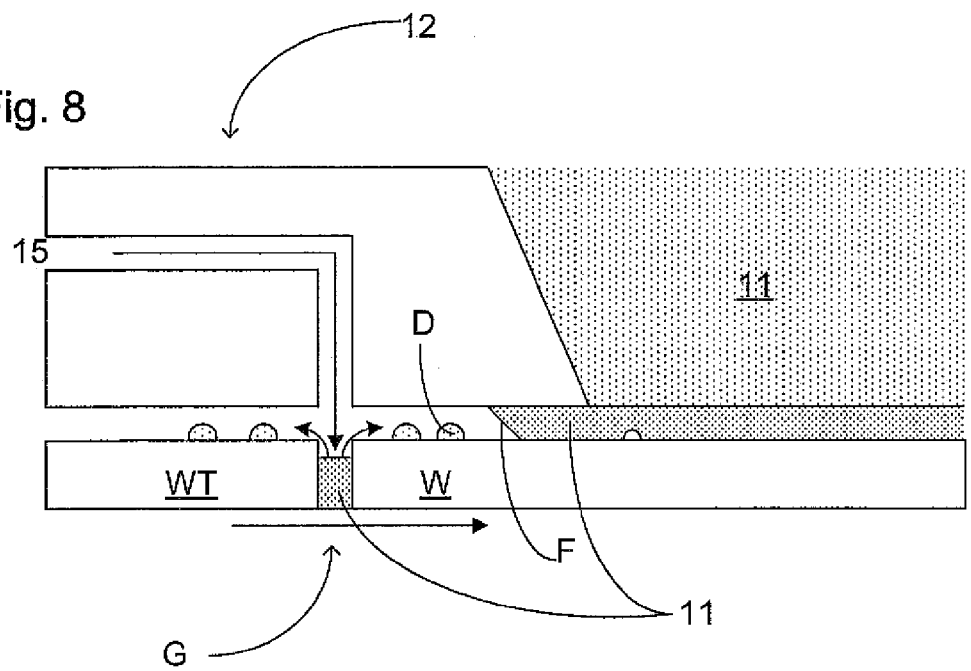
FIG. 8 depicts an immersion system according to an embodiment of the invention.

When the liquid-filled gap G passes under the fluid flow source 15, 20 or 30, e.g. the gas knife, a liquid droplet D may spray up out of the gap G as shown in FIG. 8. The droplet D may land on the surface of the substrate W and/or the substrate table WT. Depending on the relative contact angle between the surface on which the droplet D lands and the liquid of the droplet D (or, in other words, the liquidphilic (e.g., hydrophilic) or liquidphobic (e.g., hydrophobic) nature of the surface W, WT, on which the droplet D lands), the surface of the droplet D forms a greater or lesser static contact angle with the surface W, WT.

Figure 9:
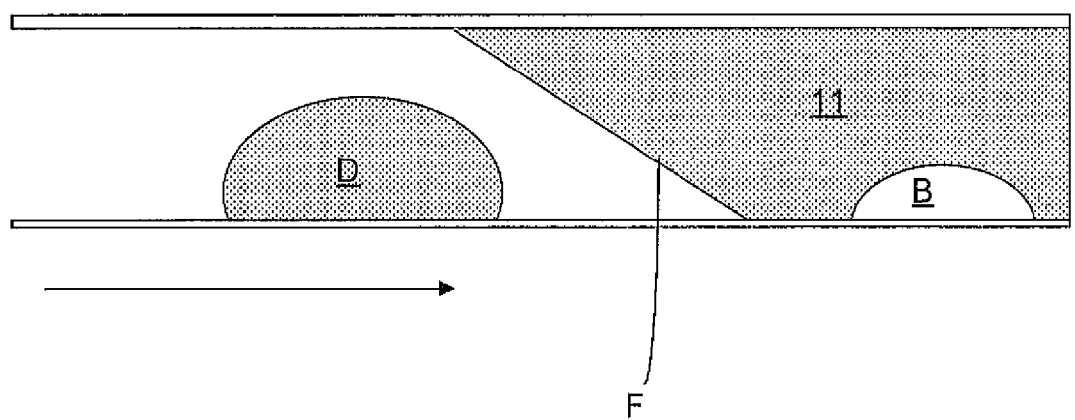
FIG. 9 depicts a schematic side view of a type of bubble formation process.

FIG. 9 shows an advancing liquid front F. The advancing liquid front F is a representation of a meniscus formed between the undersurface of the liquid confinement structure 12 and a surface of the substrate W and/or substrate table WT. (References throughout the rest of this description to the substrate W is understood to refer to the substrate table WT in addition or in the alternative, unless the contrary is indicated). FIG. 9 depicts a schematic representation because the front F is shown as a straight line, where it would normally have a curve dependent on several factors. The representation shows the general angle of the meniscus without considering the specific behavior of the meniscus near the surfaces between which the meniscus is formed. The front is also at an angle with the substrate W surface because the substrate W surface is traveling laterally with respect to the liquid front (the arrow indicates the direction of travel of the substrate W and the substrate table WT supporting the substrate W). FIG. 9 shows the relative positions of the liquid front F and the droplet D. The liquid front F and the droplet D may contact and may collide. A result of the collision may be that gas is included in the immersion liquid 11 as a bubble B. The formation of the bubble may be a consequence of one or more parameters which may exceed or fall below an associated threshold to cause the formation of the bubble B. A suitable parameter may be: a relative angle between the meeting meniscuses of the front F and the droplet D, a relative velocity between the front F and the surface of the droplet D, and/or the force caused by the collision of the droplet D with the front F. Once in the immersion liquid 11, the bubble B may move through the immersion space. The bubble may: move through the immersion space by moving through the immersion liquid, i.e. it may float; or be positioned on a surface defining the immersion space, for example, the liquid confinement structure 12, the projection system PL, the substrate W or the substrate table WT; or be positioned in a combination of the immersion space and a surface. As the bubble moves through the immersion space, it may enter the path of the patterned beam and so may cause a defect in the projected pattern.

Such a bubble might be formed by a recess passing underneath the liquid confinement structure 12. As noted previously, such a recess may be defined as a gap between the substrate table WT and the substrate W. The recess may be a gap in the surface of a sensor (e.g., transmission image sensor TIS shown in FIG. 7) or on or around a closing member (such as a closing plate) used to confine (e.g. seal) the immersion liquid in the immersion space 12 while, e.g., placing a different substrate under the liquid confinement structure. This placing of a different substrate may be referred to as a substrate swap and the substrate supporting structure may be a swap bridge. A bubble might then detach from a surface and float in the immersion liquid. The bubble may even float up to the final optical element of the projection system. The bubble may therefore affect the quality of the projected image.

Bubble formation in the immersion liquid may be addressed by preventing the formation of bubbles in the first place. This can be done by reducing the numbers of surfaces and size of the area of each surface on which a gas bubble can be trapped when the space is immersed in liquid.

This may be achieved by reducing the number of gaps, or even removing all gaps, in the substrate table. A gap may exist between an object that sits in a recess, such as a hole, defined in the substrate table WT as described above.

The immersion liquid may escape or be extracted from the gap after gap has passed under the fluid flow source, e.g. the gas knife 15. It is desirable that the substrate be substantially (almost) dry, or more desirably completely dry. The immersion liquid that has been in contact with, for example, the substrate W may absorb heat energy from the substrate W. The temperature of the substrate W may be reduced, at least in the region in contact with the droplet D. Reducing the temperature of a portion of the substrate (notably the periphery (e.g., circumference) of the substrate W) may cause a temperature gradient across the substrate surface. Such a temperature gradient may cause a variation in expansion or contraction of the substrate. Variably expanded or contracted surface portions of the substrate W may cause undesirable distortion of the substrate. This can be a source of overlay error.

An application of the principle of making a gap as small as possible in order to avoid bubbles or cooling effects on the substrate caused by remaining liquid is discussed in United States patent application publication no. 2006/0119818 and European patent application publication no. EP 1 713 113. The idea of covering a sensor with a cover comprising a window is discussed in PCT patent application publication no. WO 2005/010611.

A further application is suggested in U.S. Pat. No. 7,230,681, which describes a "hollow toroidal inflatable and deflatable bladder positioned within the groove [around the substrate]". A problem with inflating a toroidal bladder around the substrate is that the bladder will be inflated until either it reaches its maximum size (which might not be enough to fill the groove) or it touches the outer edge of the substrate. The pressure from the inflated bladder on the outside edge of the substrate may be sufficient to cause the substrate edge to warp. The warping (i.e. deformation) may cause focus problems when projecting a patterned beam of radiation onto a surface of the substrate near its edge.

In United States patent application publication no. 2007-0188731 is described, "an O-ring assembly having a deformable O-ring attached to movable support sections arranged in a generally circular configuration so as to surround the wafer." The O-ring in this document is manipulated using one or more moveable support sections. Again, the inner edge of the O-ring is intended to "engage" with the outer edge of the substrate (or wafer) in order to "effectively extend the outer surface of the wafer." As mentioned above, a potential problem with applying pressure on the edge of a substrate is not fully addressed. This document suggests having an even number of movable support sections such that the sections are in pairs, the pairs moving independently with respect to each other. In this way, the wafer is intended to center itself relative to the section, thus attempting to minimize the risk of deformation. However, if the substrate centers itself with respect to the movable sections in order not to be deformed, it is potentially no longer aligned with the rest of the metrology or exposure apparatus and the alignment or patterned radiation may not be directed to the correct portion of the substrate.

Figure 7:
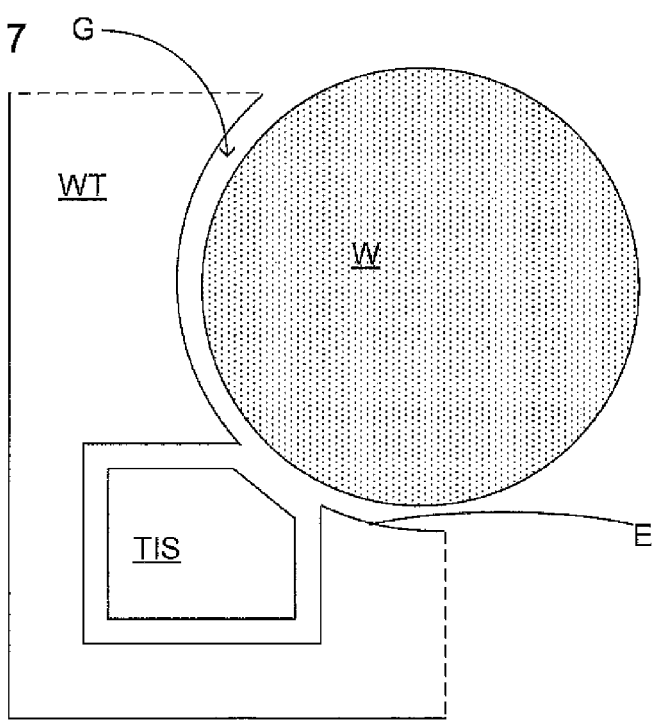
FIG. 7 depicts a plan view of a substrate table according to an embodiment of the present invention.

FIG. 7 is a plan view of part of a substrate table WT. An object may be placed in a recess defined in the substrate table WT or on a surface of the substrate table WT. Such an object may be: the substrate W, a sensor TIS, a cleaning station (not shown), a closing disc (not shown), and/or a cover plate for at least one of the previously-mentioned objects. Each object generally sits in an associated recess or indent. The recess is intended for the object with which it is associated. The recess may have an edge E. The substrate W may, for instance, by supported by a substrate holder (not shown) within the substrate table WT. The reason for the gap G between each object and the edge of the associated recess is that the object is removable. It is desirable for the object to be easily removable from its associated recess. The object may be replaced after removal. There are certain tolerances that are used in order for an object in or on a substrate table to be easily removed and/or exchanged. In an embodiment, the standard tolerance may be of the order of 300 μm. To reduce bubble formation, the gap is to be reduced to a small fraction of the standard tolerance. One way to reduce the gap includes reducing the size of the area made to receive the object. However, merely reducing the gap by decreasing the tolerance does not allow for a change in a cross-sectional dimension (e.g., a diameter) of the object (e.g. a substrate) during the lifetime of the object. The dimensions of an object can change, e.g. shrink or expand, during its lifetime due to, for example, processing. The dimensions of a substrate, for example, may alter during its lifetime as a processing step, such as edge bead removal, may be applied altering, for example removing, at least a part of the substrate. Reduction of the tolerance could achieve at best reduction in the risk of bubble formation when the dimensions of the substrate are at their largest, for example for its first use. After successive processing the dimensions of the substrate may reduce, causing the effective tolerance to increase with processing steps and thus increasing the risk of bubble formation.

A solution that involves direct contact with the edge of the object in order to close the gap can result in a heat transfer, e.g. thermal energy removal from the object. A consequence of this heat transfer is deformation, e.g. bending or curling, of the object. Contact of the object edge may apply a compression force to the edge. The compression force may result in deformation of the object. Additionally or alternatively, the deformation may be deviation from perfect flatness of the object because of pressure on its edge. This can give rise to, for example, focus problems on illumination of the object.

An embodiment of the present invention uses a system to reduce the effects of the gap G as shown in FIGS. 10 to 20. Please note that reference in the following text to the gap associated with a substrate W (and references to the substrate W in relation thereto) refers more generally to a gap associated with an object supported, in use, on the substrate table (and the object itself in relation thereto), unless expressly stated otherwise.

An embodiment uses a gap-reducing mechanism, which may be a controller and actuator to effect movement of the object within the space defined by an edge in a surface of the substrate table. Alternatively or additionally, the gap-reducing mechanism may include an edge member that fills the gap and is placed in position in the gap and is manipulated to surround the object using a controller and information about the gap and/or about the size and shape of the object.

A desirable feature of an embodiment of the present invention is the measurement of the substrate in a pre-aligner or pre-alignment system (also known as a "wafer handler") WH. The measurement may be before the substrate is positioned on the substrate table WT. The measurement of the substrate W may involve measuring one or more of: the average cross-sectional dimension (e.g., diameter) of the substrate; the average distance from the edge of the substrate to an unmoving center of the substrate (e.g., radius); a variation of such dimension or distance over the peripheral range of the substrate; or a measurement of the position of the edge of the substrate with respect to a default or model substrate; or shape of the substrate. The objective of measuring the substrate W is to determine with at least improved accuracy the location of the edge of the substrate. This enables the substrate to be positioned on the substrate table WT. The positioning of the substrate edge may be relative to the edge of substrate table WT with which the substrate W edge defines a gap G between the substrate table and the substrate. Alternatively or additionally, the shape of the substrate W may be measured in order to determine the variation in distance from a center of the substrate to the edge of the substrate. For accurate positioning of the substrate relative to the substrate table, the edge of the substrate table at the gap G may be measured prior to positioning of the substrate on the substrate table.

The substrate may be supported on the substrate table by means of a substrate holder. A substrate holder may simply be an indent defined in the substrate table. The substrate holder may be a substrate-shaped surface with one or more vacuum outlets to hold the substrate in place, or any feature that is capable of holding (e.g., supporting) the substrate in position on or in the substrate table. A substrate holder generally has a groove or gap G around the substrate to allow, e.g., positioning of the substrate in alignment with metrology or exposure tools, as discussed above.

Figure 10:
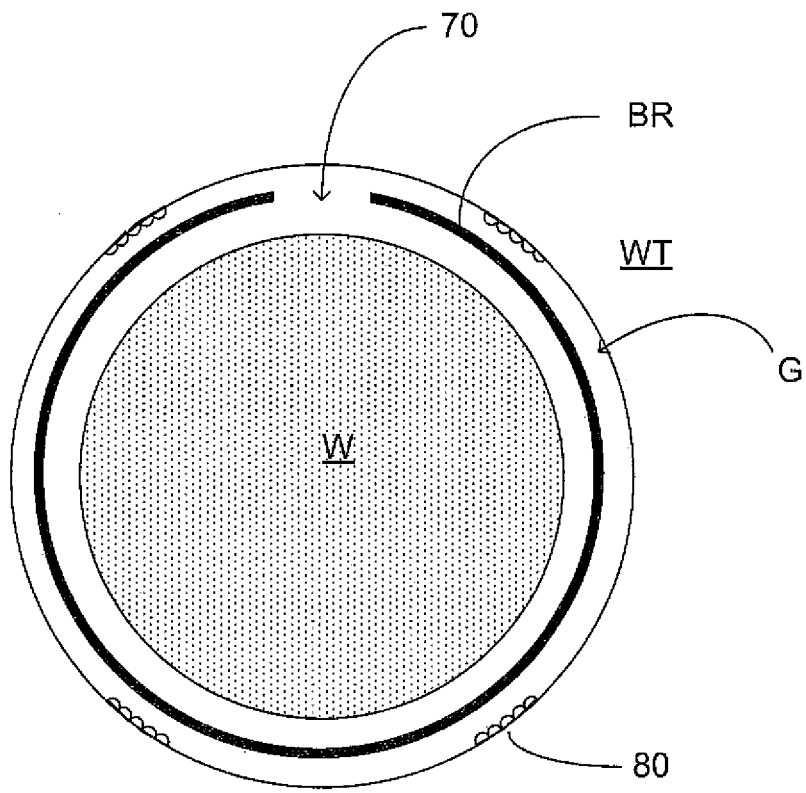
FIGS. 10 and 11 depict examples of a ring in a gap between a substrate and a substrate table.
Figure 11:
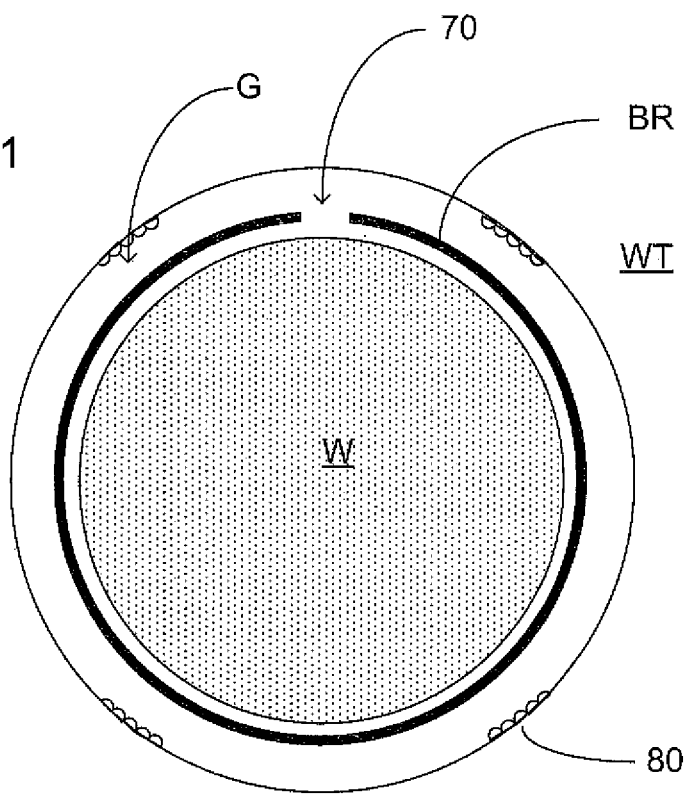

FIGS. 10 and 11 show a substrate table WT containing a substrate W in an indent in the surface of the substrate table WT. The portion of the indent in the substrate table WT that surrounds the substrate W is referred to as a gap G. It is in this gap G that a bubble may form according to the methods described elsewhere. In order to make this gap as small as possible, either the substrate W may be positioned in such a way that the gap G is minimized, or an edge member BR may be used as described below. The minimization of the gap may occur at a position of the substrate table where a device such as a metrology device or an exposure device is located at the time. The substrate may be moved so that the gap is minimized at different locations within the indent depending on the relative location of the device. Alternatively or in addition, an edge member BR may be inserted into the gap G. Various embodiments of an edge member will be described below.

FIGS. 10 and 11 also show an example of a type of sensor which may be incorporated into the substrate table WT. The sensor 80 may be positioned within the gap G in the substrate table WT or elsewhere in the indent of the substrate table WT so that it may measure the edge of the substrate W. The measurement of the substrate edge may then be fed to a controller which will control the movement of either the substrate W or the edge member BR.

A variant to having a sensor in the substrate table WT is described in relation to FIG. 12. Specifically, in an embodiment, the sensor 80 is not necessarily in the substrate table, but in a pre-aligner (PA) WH (though a sensor may also be in the substrate table). The pre-aligner WH is where the substrate W has a physical property, for example its diameter, measured. The resultant measured physical property (e.g., diameter, or range of diameters (if the substrate is not a perfect circle), is then sent to a gap-reducing system associated with or in the substrate table WT. The gap-reducing system is discussed below. The substrate that has been measured is loaded onto the substrate table WT.

The gap-reducing system may have an edge member which forms the edge of the substrate table at the gap G. The edge member may be in the shape of a ring known as a Bubble Extraction System (BES) ring. The edge member may be introduced around the periphery, i.e. the circumference if the substrate is substantially circular, of the substrate W. The edge member may be manipulated in such a way that it reduces a gap between the edge of the surface of the substrate table and the substrate edge as much as possible. The edge member may be clamped into place. The substrate W may be measured for a characteristic such as alignment and overlay. The substrate W and substrate table WT may be moved into position (to an exposure position) for exposure by the projection system PS.

FIG. 12 shows the various software-related actions and hardware actions. A software-related action is shown with dotted arrows on FIG. 12. A hardware action is shown with solid arrows on FIG. 12. A controller operating according to software enables a sensor operated by the controller to measure the substrate edge. With the measurement data, the controller calculates a parameter of an edge property of the substrate, such as its diameter. The controller sends the parameter data to a controller that controls the substrate table. The controller that controls the substrate table may initiate the positioning and manipulation of the edge member to fill the gap G most efficiently as described elsewhere; that is, to fill the gap enough to help prevent the formation of a bubble while substantially preventing deformation of the substrate.

There are several ways in which the edge of the substrate may be measured in the pre-aligner. One way to measure the edge of the substrate is to have a series (or array) of sensors or a movable sensor surrounding the substrate in the pre-aligner. This sensor or series of sensors may measure the distance from the known position of the sensor to the edge of the substrate. In this way, a relative position of the edge of the substrate is measured.

Alternatively or additionally, a detector may detect radiation that is reflected from the top surface of the substrate. Such a detector may measure how large the distance is from the center of the substrate in any direction. In the same way, the shape of the substrate may be determined. Alternatively or additionally, the physical property information of the substrate may be determined from a photograph or other sensor or detector set-up.

A profile of the substrate edge may be obtained. The profile may be in the x- and y-coordinates to obtain a profile of the substrate edge in the plane of the substrate. Optionally, z-coordinates may be obtained to obtain a profile of the substrate in three dimensions. Having a displacement of the substrate edge in the z-axis is significant as it introduces a height step between the substrate and the substrate table on which the substrate is supported. A height step may be a source of bubble inclusions. The detection of an edge profile in the z-axis as well as in the x- and y-axes may therefore be useful.

An indentation, marker or notch that may be present on the substrate W for alignment purposes may also be used as a marker for measuring the substrate edge. Knowing a diameter (for example) of the substrate is useful for reducing the gap around the substrate. However, knowing the variation of such a dimension of the substrate over time can be even more useful. In order to enable measurement of the variation, a marker is useful. This marker could be the indentation, marker or notch mentioned above. The marker may have a certain (e.g. predetermined) position with respect to the substrate, e.g. on the substrate W.

Using a sensor 80 either in a pre-aligner WH as described above, in the indent in the substrate table WT, or on an edge member may give rise to a measurement of the substrate edge. Any of the measurements mentioned elsewhere (of radius, radius variation, shape or profile, for example) may be measured in any of these positions.

Rather than (or in addition to) an edge sensor being present in the pre-aligner, it may be a sensor in the edge member itself that detects the substrate. The edge member may have a sensor at a number of locations. The locations may be fixed. The locations may be around the periphery of the gap. The controller of the edge member may therefore carry out both the measurement and the adjustment of the size of the edge member. Alternatively or additionally, a sensor may be placed in the substrate table to measure an already-positioned substrate. A sensor may be in the outer edge of the gap (i.e. in an inner edge or a substrate-holding space in the substrate table as shown in FIGS. 10 and 11), or elsewhere in or on the substrate table. According to an embodiment, a sensor may be positioned in a separate stand-alone device.

In addition or alternatively to measuring the substrate itself, a sensor may be used that measures the gap G surrounding the substrate W. FIG. 13 depicts a flow chart similar to the flow chart of FIG. 12, but with the sensing of the gap being carried out in the substrate table. In the embodiment where the gap is measured directly, this is desirably carried out in the substrate table, as that is the gap that is desirably minimized. In FIG. 13, rather than the diameter of the substrate being measured in the pre-aligner WH and this information used to control the gap G at the substrate table WT, the gap G is measured directly in the substrate table WT. The rest of the hardware action is the same as for the embodiment of FIG. 12. For example, measuring the width of the gap G gives rise to a measurement that may be interpreted by a controller to position or manipulate an edge member BR directly according to the measurement. For example, if a gap of a specific width is measured, the edge member BR may be pre-set to be the same width or slightly smaller (if the substrate is not to be contacted by the edge member BR). An advantage of measuring the gap rather than (or as well as) the substrate edge is that a step of estimating the distance between the edge of the substrate table and the edge of the substrate may be omitted because this distance is calculated directly.

An advantage that applies to measuring the gap directly as well as to measuring the substrate is that variation in the gap size may be measured as the variation occurs (e.g. during processing of the substrate). Variation of the shape or size of the substrate may change outside of the lithographic exposure apparatus. Thus, when the substrate is reintroduced into the lithographic apparatus for exposure after processing, it is useful to have an adjustable edge member to adjust to these changes in shape or size. A direct feed or input to the controller that controls the edge member may then be arranged. As the gap width varies, the edge member width may also vary accordingly. This may be done in real time with few steps or calculations between the measurement of the gap and the variation of width or position of the edge member.

As mentioned elsewhere, the measurement step may be done in different ways. The measurement step is the step that determines how large the gap G is. This same step then determines what shape and size the edge member will be or how the substrate W needs to be moved within the indent in the substrate table WT. The measurement step may include measuring the edge of the substrate. Alternatively or additionally, the measurement step may include measuring a parameter of the gap G itself. A difference between these two measurement steps is that when measuring the gap G directly, the positioning of the gap (e.g. with respect to a model or default point) is taken into account directly. When measuring the gap directly, any tolerance and positional accuracy of the edge member BR may also be taken into account.

Measuring the gap G itself may be done using a sensor in the edge member. The measurement may be capacitive, use triangulation, use an interferometer, use a gas gauge, etc. In an embodiment, a level sensor may be used. A way in which a level sensor may be used is by measuring the gap G at a number of positions (e.g. 6 or 8 positions). The measurements are then used to calibrate substrate position. The way the level sensor works is by transmitting an optical signal to a reflective surface (e.g. on the substrate) at various angles and capturing the reflected optical signal in a sensor. The angle and roughness of the surface of the substrate may thereby be measured.

In an embodiment, where the edge of the substrate W is measured, the edge of the substrate W may be measured in the pre-aligner WH with respect to a feature on the substrate such as a marker. This same marker may then be used on the substrate table to determine the relative position of the substrate with respect to the substrate table and with respect to the measurements made of the edge of the substrate. In this way, the information regarding the position of the substrate may also be used to actively reduce the gap.

There are then several ways in which the edge member may be positioned or manipulated in order to reduce the gap between the edge member and the edge of the substrate. It is desirable to have data regarding where the edge of the substrate is all around its periphery, rather than just an average. This is so that the edge member BR may be accurately positioned all around the periphery of the substrate W. The reason for this is to help prevent the edge member from contacting or pressing into the edge of the substrate W, thereby causing focusing or alignment errors. It is also useful for the edge member to be accurately positioned close to the edge of the substrate to prevent variations in the width of the gap around the edge of the substrate. This may be achieved by using a deformable ring as an edge member.

At least two embodiments are envisaged for the deformable ring. A first embodiment has a ring consisting of a single part and a second embodiment has the ring consisting of multiple sections. According to an embodiment, the ring may be actuated as a whole. According to an embodiment, one or more portions of the ring may be actuated separately. In this case, the ring may be a whole but deformable ring, or it may be made up of several independent parts. In this way, various portions of the ring may be able to adapt to the varying shape of the substrate. The edge member may be made up of a plurality of separately movable sections. Alternatively, as discussed elsewhere, the edge member may comprise an eccentrically moveable ring. In terms of ease of manufacture, a deformable ring with an opening in its periphery is easiest to manufacture. This type of edge member is described elsewhere in this document. As used herein, a ring should not be understood as necessarily being circularly shaped. While the ring may be circularly shaped, it may have instead, for example, a polygonal shape, an oval shape, etc.

Although it is generally desirable not to have an edge member contact the edge of the substrate W, the edge member may contact the edge of the substrate W in an embodiment. If an edge member contacts the edge of the substrate W, a gap between the substrate and the edge member is reduced effectively to zero. Having substantially no gap G means that bubbles will likely not be able to form in the gap G. In the case where the risk of bubbles forming in a gap is more serious than the risk of deformation of the substrate, it may be desirable to have the edge member contact the edge of the substrate W. On the other hand, it is generally desirable to have a gap G minimized as much as possible while still not contacting the substrate edge. This is to strike a balance between the potential formation of bubbles and the potential deformation of the substrate W.

Various possible embodiments of an edge member are shown in FIGS. 10, 11 and 14 to 20.

An edge member in the form, for example, of a BES ring BR, is introduced around the periphery of the substrate W as shown in FIG. 10. This edge member BR has an opening 70 in its periphery (e.g., circumference). This opening may be opened or closed within the range of the opening 70 in order to enable the edge member BR to fit accurately within the gap G. The edge member BR is therefore desirably deformable. The edge member BR may be actively deformable so that its cross-sectional dimension (e.g., diameter) may be actively adjusted based on the change in cross-sectional dimension (e.g., diameter) of the substrate during the exposure/development of the substrate. The size of the opening 70 in the edge member BR may be chosen such that when the opening 70 is closed to zero separation, the cross-sectional dimension of the edge member is correct for the particular gap G. This may be measured in advance. The gap between the substrate W and the edge member BR is desirably not completely closed in order to prevent the edge member BR from touching the substrate W. This is to help to avoid one or more of the problems discussed herein with respect to pressure on a substrate edge. The gap between the substrate W and the edge member BR should nevertheless be small enough to reduce one or more of the potential problems caused by bubbles and liquid extraction.

When the edge member BR is in place in the gap and its cross-sectional dimension is reduced (or increased) so that it fills the gap as much as possible, desirably without contacting the substrate, the liquid confinement system may pass over the substrate and substrate table. In this situation, the immersion space is filled with fluid (e.g., liquid) and the gap G is desirably reduced enough that little or no liquid seeps into the gap G between the substrate W and edge member BR. Any gap G that remains between the substrate edge and the edge member BR is desirably small enough that the surface tension of the liquid in the liquid confinement system maintains a meniscus over the gap and keeps the liquid in the immersion space and not in the gap. As a result of the strength of the meniscus, fluid bubbles are desirably not able to be released from the gap G which is substantially filled with the edge member BR. Thus, the production of a bubble is less likely.

The cross-sectional dimension of the edge member BR may be manipulated or adjusted using any of a number of methods. For instance, an edge member support system may be incorporated into the substrate table WT. The edge member support system may receive the cross-sectional dimension information from the pre-aligner. The edge member support system may then program a position for each of a number of portions of the edge member BR. When the substrate W is loaded onto the substrate table WT, each portion of the edge member BR may be brought into a programmed position that accurately reduces the gap between the substrate W and the edge member BR.

Figure 14:
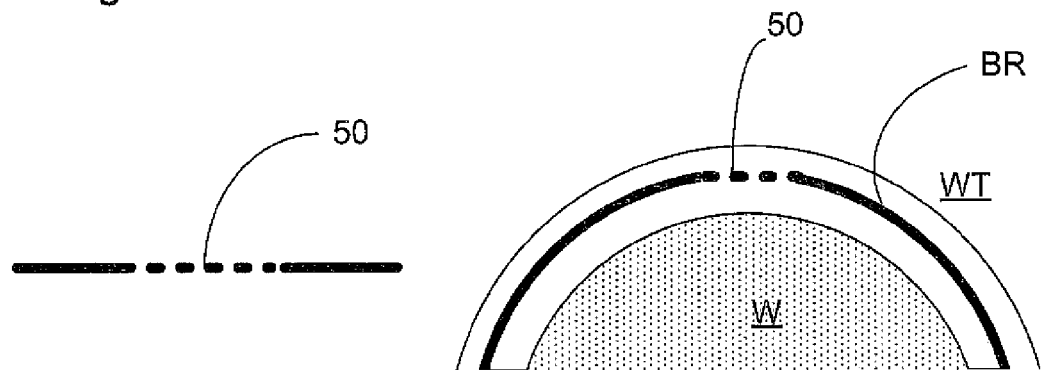
FIGS. 14, 15 and 16 depict embodiments of closing arrangements of the ring according to an embodiment of the invention.
Figure 15:
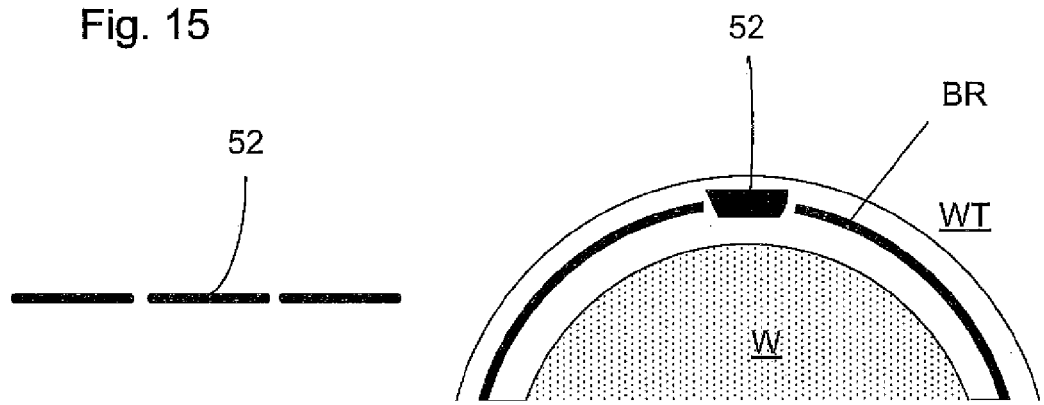
Figure 16:
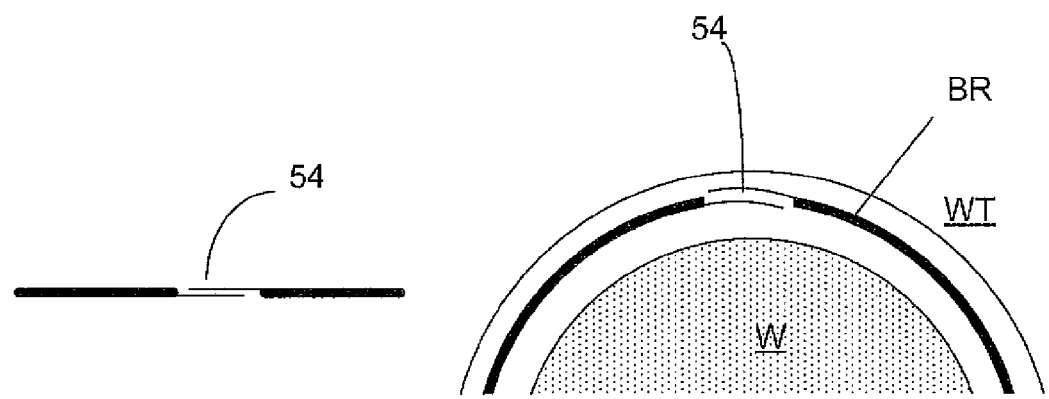

A further edge member and associated manipulation method is schematically depicted in each of FIGS. 14, 15 and 16. The embodiments shown in each of these Figures comprises a desirably compressible edge member BR as in FIGS. 10 and 11. However, the opening 70 is not simply left open in these embodiments, as this would introduce a hole or recess in the system where a bubble could be formed. An embodiment considers the case when the edge member BR is put into a position in the gap G and the opening 70 of the edge member BR is not completely closed. FIG. 14, for instance, shows a flexible material 50 in the place of the opening 70. A range of flexible material 50 sizes may be available depending on how large an opening 70 is left after positioning of the edge member.

FIG. 15 shows a separate part of an edge member 52 that may be inserted depending on the compression of the edge member BR. Again, if the edge member BR is used for slightly differently sized substrates W, a variety of edge member parts 52 may be available to plug the opening 70. When the liquid confinement system 12 passes over the opening 70, the edge member part 52 may help prevent a bubble from forming in what would otherwise be a hole (in the opening 70).

FIG. 16 shows an embodiment where the ends of the edge member overlap 54. In this way, no extra gap is introduced at this site of the opening. The edge member BR is deformable such that the ends of the ring that overlap 54 may be compressed to prevent a variation in width of the edge member about its periphery. This prevents a gap from being created within the substrate table WT recess where the edge member BR does not overlap. Again, if a gap, recess or hole is substantially blocked, there is little or no space for a bubble to form.

Figure 17:
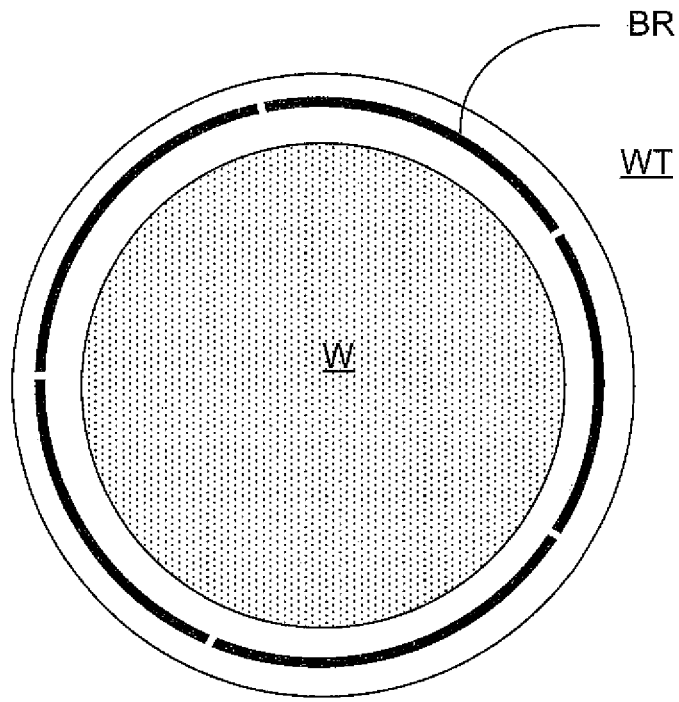
FIGS. 17, 18, 19 and 20 depict embodiments of the ring according to an embodiment of the present invention.

FIGS. 17, 18, 19 and 20 each show further embodiments of the edge member. FIG. 17 shows a segmented edge member BR. The segments may be moved relative to each other such that the gaps between the segments are reduced or such that the segments even overlap with each other. Once a substrate has been measured, it is placed on or in a recess on the substrate table WT. Information regarding the measured parameters is input into the controller of the edge member BR. The controller calculates where each segment is to be positioned in order to minimize the gap between each segment and its adjacent portion of substrate edge. Once the substrate is in place, each segment of the edge member BR is moved individually to a calculated position. This embodiment is useful in the case of a substrate with a non-uniform periphery (e.g. which is not a perfect circle). This is because segments may be moved closer to the center of the substrate at portions of the substrate that have a smaller distance from the center to the edge than other portions.

Figure 18:
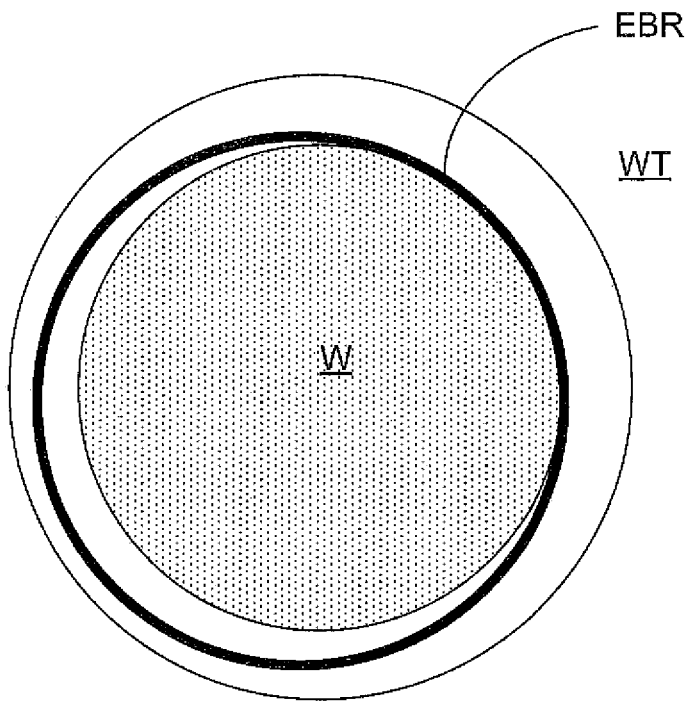

FIG. 18 shows an edge member which is effectively an eccentrically moveable edge member EBR. Rather than being compressed or changing its cross-sectional dimension, the edge member BR is moved eccentrically compared to the substrate W. The eccentric movement depends on the position of a metrology device, an exposure device or other device (e.g. fluid flow device such as a gas knife) that is passing over the edge of the substrate. Having the edge member EBR adjacent the portion of the substrate edge over which the device is passing helps protect the device and the fluid confinement system that might otherwise be affected by bubbles in the immersion liquid. The gap between the edge member EBR and a substrate W may be most reduced at the position where the device is active at that point so that there is a minimum gap below the point where the device is passing. The edge member may thereby be moved (by an actuator or similar device controlled by the controller) around the periphery of the substrate according to a programmed or a sensed movement of the device. Having a reduced gap below where the device is active helps minimize the likelihood of bubbles at that position. If the device causes bubbles, or may be adversely affected by bubbles, a reduced likelihood of bubbles at that position is advantageous.

Figure 19:
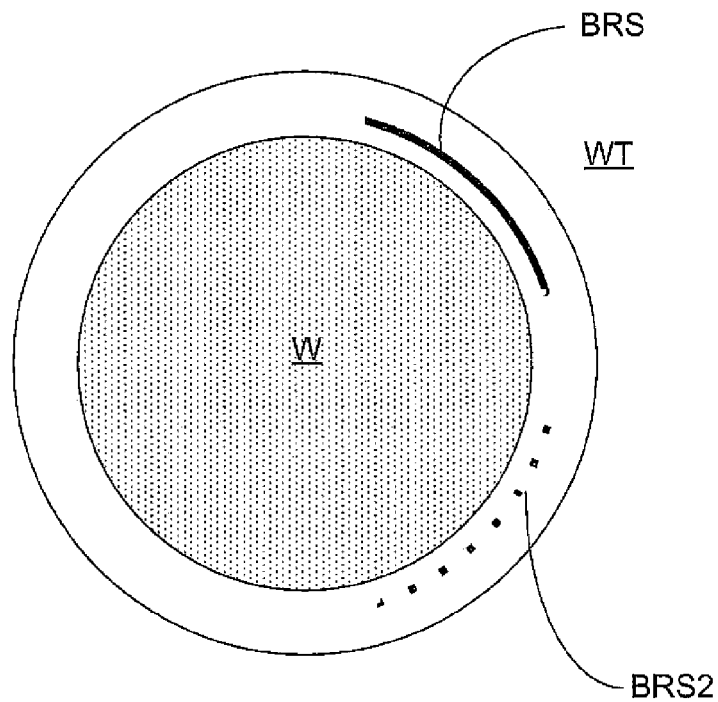

FIG. 19 shows a single moveable segment BRS which is an arc-shaped segment of an edge member. This segment may move around the periphery of the substrate, for example, to a position BRS2, again according to a sensed position of any metrology, exposure or other device at or near a gap between the substrate and the substrate table edge and/or a certain (e.g., predetermined) timing of any metrology, exposure or other device to be at or near a gap between the substrate and the substrate table edge. The segment BRS may be approached towards the substrate W according to the position of a device above the substrate table and/or the segment BRS may be approached from the substrate W according to the position of a device above the substrate. The gap between the segment BRS and a substrate W may be most reduced at the position where the device is active at that point so that there is a minimum gap at the position where the device is passing. The segment may thereby be moved (by an actuator or similar device controlled by the controller) around the periphery of the substrate according to a programmed or sensed movement of the device. Having a reduced gap below where the device is active helps minimize the likelihood of bubbles at that position. If the device causes a bubble, or may be adversely affected by a bubble, a reduced likelihood of a bubble at that position is advantageous.

Figure 20:
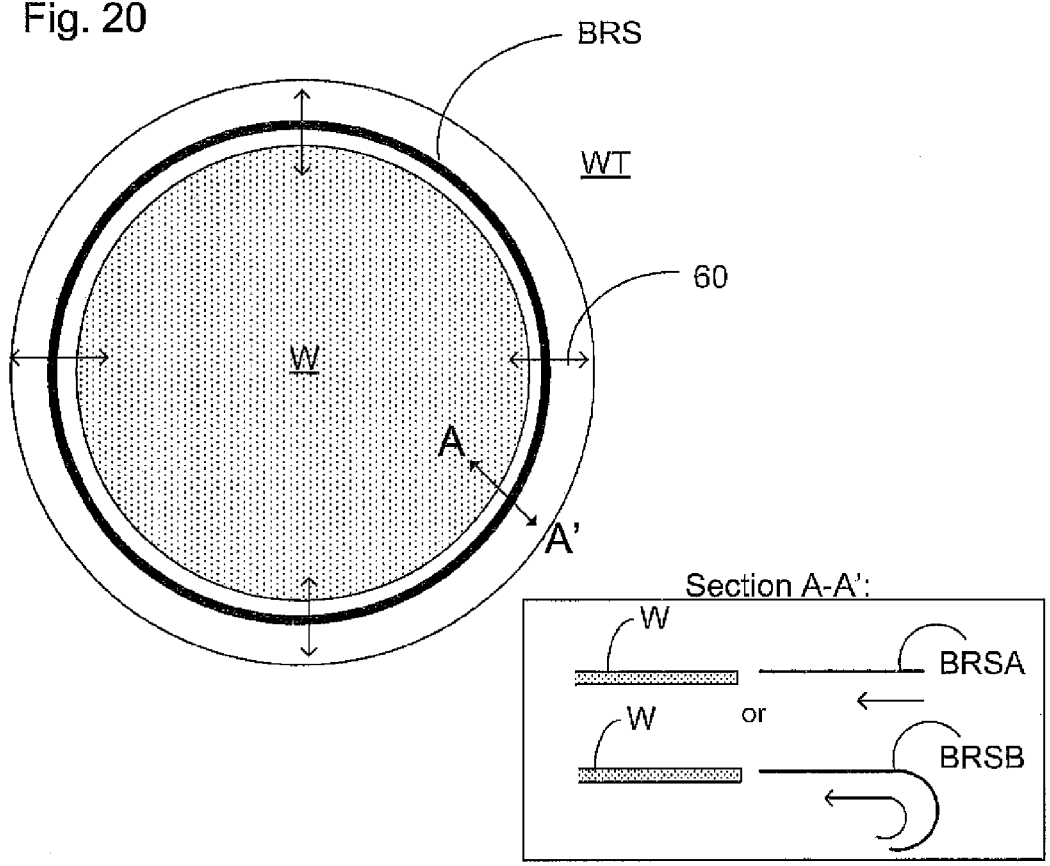

FIG. 20 shows a "strainable" edge member BRS which is either stretched or rolled out of the way of the substrate when the substrate is inserted or removed and allowed to compress back into place in a controlled manner in order to approach the outside edge of the substrate W. Alternatively or additionally, a force may be applied in order to compress the edge member. The section A-A' is shown in the box in FIG. 20. The top example BRSA shows an edge member that is either stretched away from or compressed towards the substrate W. The bottom example, BRSB, shows an edge member that is effectively rolled away from or towards the substrate. Once a substrate has been measured, it is placed on or in a recess in the substrate table WT. Information regarding the measured parameter of the substrate is input into the controller of the edge member BRS. The controller calculates by how much the edge member should be rolled or unrolled (or stretched or compressed) in order to reduce the gap between the edge member and its adjacent portion of the substrate edge. Once the substrate is in place, the edge member BRS is unrolled or compressed (e.g., its diameter is decreased, as the diameter had to be larger in order to allow the placement of the substrate in the recess) to a calculated (or detected) position. An advantage of this embodiment is that the full gap G can be easily filled, as the outside edge of the edge member BRSB nearest the edge of the substrate table WT is stationary and does not risk being inadvertently moved during minimizing of the edge member cross-sectional dimension.

The skilled person will be able to consider the disclosure herein and come up with alternative ways of manipulating an edge member based on measurements of the outside edge of the substrate that fall within the scope of the claims.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine-readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

By "lithographic tool" or "lithographic cell", a system is understood that contains not only an exposure or lithographic projection apparatus for exposing the substrate (by projecting patterned radiation onto the substrate), but also other pre- and post-exposure devices such a device for baking and/or developing the (resist on the) substrate.

In an embodiment, there is provided a method of reducing a gap between a substrate and a substrate table in an immersion lithographic apparatus. The method comprises: measuring, and reducing. In the measuring, a physical property of the substrate is measured. In the reducing, a gap defined between an edge of the substrate and an edge of a surface of a substrate table is reduced. The substrate table supports the substrate in the immersion lithographic apparatus. The gap is reduced based on the measured physical property of the substrate.

The method may comprise loading the substrate onto a pre-aligner. The method may comprise performing the measuring of the physical property of the substrate in the pre-aligner. The method may comprise sending the measured physical property of the substrate to a gap-reducing mechanism associated with the substrate table. The method may comprise loading the substrate into a space defined by an inner edge of a surface of the substrate table. The method may comprise reducing the gap between the edge of the substrate and the edge of the surface of the substrate table using the gap-reducing mechanism based on the measured physical property of the substrate. The measuring the physical property of the substrate may comprise detecting an outer edge of the substrate in order to determine a cross-sectional dimension of the substrate. The measuring the physical property of the substrate may comprise detecting a position of an outer edge of the substrate relative to a certain position. In an embodiment the certain position is a marker on the substrate.

Measuring the physical property of the substrate may comprise measuring a shape of the substrate. Measuring the physical property of the substrate may comprise measuring a range of distances from the center of the substrate to the edge of the substrate.

In an embodiment, there is provided a method of reducing a gap between a substrate and a substrate table in an immersion lithographic apparatus. The method comprises measuring, and reducing. In the measuring, a gap defined between an edge of the substrate and an edge of a surface of a substrate table is measured. The substrate table supports the substrate in the immersion lithographic apparatus. In the reducing, the gap is reduced based on the measurement.

The method may comprise: loading, carrying out and reducing. In the loading, the substrate may be loaded into a space defined by an inner edge of a surface of the substrate table. In the carrying out, the measuring may be carried out. In the reducing, a gap between the edge of the substrate and the edge of the surface of the substrate table may be reduced, based on the measurement, using a gap-reducing mechanism.

Reducing the gap may comprise positioning the substrate with respect to the edge of the surface of the substrate table such that the gap between the edge of the substrate and the edge of the surface of the substrate table is minimized. Reducing the gap between the substrate and the substrate table may comprise positioning an edge member in the gap. The method may comprise clamping the edge member into place once the edge member has been manipulated. Positioning the edge member may comprise reducing its inner cross-sectional dimension to a size substantially the same as a cross-sectional dimension of the substrate. The edge member may be compressible. Positioning the edge member may comprise compressing the edge member in such a way that a cross-sectional dimension of the edge member is reduced.

The edge member may comprise a plurality of arc-shaped segments. Positioning the edge member may comprise moving the plurality of arc-shaped segments toward each other to reduce a distance between the center of the edge member and the edge of the edge member. The edge member may comprise a substantially rigid ring. Positioning the edge member may comprise moving the edge member in the same plane as the substrate eccentrically such that a gap between a portion of the edge member and a portion of the substrate varies over time. The edge member may comprise an arc-shaped segment. Positioning the edge member may comprise moving the segment around the periphery of the substrate such that a section of the substrate edge adjacent which the segment is positioned varies over time. The edge member may comprise an incomplete ring with two ends defining an opening in the ring. The opening may be configured to decrease in length as the edge member is compressed to decrease a cross-sectional dimension of the edge member. A segment of the edge member may be removable to create the opening.

A portion of the edge member may be made of a compressible material. Positioning the edge member may comprise compressing the portion peripherally, thus reducing the cross-sectional dimension of the edge member. The edge member may comprise an incomplete ring shape. The incomplete ring shape may have two ends in its periphery. The ends may be configured to overlap while the edge member is compressed to reduce the cross-sectional dimension of the edge member. The ends may be configured to meet while the edge member is compressed to reduce the cross-sectional dimension of the edge member.

In an embodiment, there is provided a device manufacturing method. The method comprises: loading, measuring, loading, reducing and exposing. In the loading, a substrate may be loaded onto a pre-aligner. In the measuring, a physical property of the substrate is measured at the pre-aligner. In the loading, the substrate from the pre-aligner is loaded onto the substrate table. In the reducing, a gap between an edge of the substrate and an edge of a surface of the substrate table is reduced based on the measured physical property. In the exposing, the substrate is exposed with patterned radiation.

During at least the exposing of the substrate, the gap is moved under immersion liquid. The immersion liquid is confined in a space defined between a projection system, a liquid confinement structure and a surface co-planar with the substrate and the substrate table. The surface comprises a surface of the substrate table or the substrate. The method may comprise communicating the measured physical property of the substrate to a substrate table configured to support the substrate.

In an embodiment, there is provided a device manufacturing method. The method comprises: loading, measuring, reducing and exposing. In the loading, a substrate is loaded into a space defined by an edge of a surface of a substrate table. A gap is defined between the edge of the surface of the substrate table and an edge of the substrate. In the measuring, a physical property of the substrate in the substrate table is measured. A size of the gap is measured. In the reducing, the gap between the edge of the substrate and the edge of the surface of the substrate table is reduced using a gap-reducing mechanism. The gap-reducing mechanism performs the reducing based on the measured physical property of the substrate and the measured size of the gap. In the exposing, the substrate is exposed with patterned radiation.

A pre-aligner may be configured to transmit information regarding the measured physical property of the substrate to the gap-reducing mechanism. The gap-reducing mechanism may be configured to reduce the gap between the edge of the substrate and the edge of the substrate table so that it is minimized.

In an embodiment, there is provided a lithographic projection apparatus comprising: a pre-aligner, a substrate table and a gap-reducing mechanism. The pre-aligner includes a measurement mechanism configured to measure a physical property of a substrate. The substrate table is configured to support the substrate in a space defined by an edge of a surface of the substrate table. The gap-reducing mechanism is configured to reduce a gap defined between an edge of the substrate and the edge of the surface of the substrate table based on information regarding the measured physical property of the substrate.

The lithographic projection apparatus may comprise a projection system configured to direct a patterned beam of radiation at a target portion of the substrate. The lithographic apparatus may comprise a liquid confinement structure configured to supply and at least partly confine immersion liquid to a space defined between the projection system and a surface co-planar with the substrate and the substrate table. The surface may comprise a surface of the substrate table or the substrate. The liquid confinement structure and/or the substrate table may be configured to move with respect to the other such that there is relative displacement between the gap and the liquid confinement structure.

In an embodiment, there is provided a lithographic projection apparatus comprising: a substrate table; a measurement mechanism and a gap-reducing mechanism. The substrate table is configured to support a substrate in a space defined by an edge of a surface of the substrate table so as to define a gap between the edge of the surface of the substrate table and an edge of the substrate. The measurement mechanism is configured to measure a physical property of the substrate and a size of the gap. The gap-reducing mechanism is configured to reduce the gap between the edge of the substrate and the edge of the substrate table based on the measurement by the measurement mechanism.

The measurement mechanism may be configured to carry out measurement as described herein. The gap-reducing mechanism may be arranged to carry out the method described herein.

In an embodiment, there is provided a lithographic tool comprising a lithographic projection apparatus as described herein.

In an embodiment, there is provided a method of three-dimensional profiling of an edge of a planar substrate in an immersion lithographic or metrology apparatus. The method comprises: measuring a physical property of the substrate in the plane of the substrate and in a direction perpendicular to the plane of the substrate.

In an embodiment, there is provided an apparatus for a metrology tool or a lithographic projection apparatus. The apparatus comprises a pre-aligner including a measurement mechanism. The measurement mechanism is configured to measure a physical property of an edge of a planar substrate in order to determine the three-dimensional profile of the edge.

The pre-aligner may be configured to measure the physical property in the plane of the substrate. The pre-aligner may be configured to measure the physical property in a direction perpendicular to the plane of the substrate.

In an embodiment, there is provided an apparatus for a metrology tool or a lithographic projection apparatus. The apparatus comprises a substrate table and a measurement mechanism. The substrate table is configured to support a substrate in a space defined by an edge of a surface of the substrate table so as to define a gap between the edge of the surface of the substrate table and an edge of the substrate. The measurement mechanism is configured to measure a physical property of the substrate and a size of the gap. The measurement mechanism is configured to measure a physical property of an edge of the substrate so as to determine the three-dimensional profile of the edge.

The descriptions above are intended to be illustrative, not limiting. Thus, it will be apparent to one skilled in the art that modifications may be made to the invention as described without departing from the scope of the claims set out below.

The invention claimed is:

1. A method of reducing a gap at and between a convex edge of a substantial part of a substrate and an edge of a substrate table in an immersion lithographic apparatus, the substrate table configured to support the substrate and the convex edge curving outwards in a plane coplanar with a surface of the substrate onto which radiation is projected by the lithographic apparatus, the method comprising:

reducing the gap by positioning of an edge member in the gap, the gap being reduced based on a measured physical property of the substrate.

2. The method according to claim 1, further comprising:
loading the substrate onto a pre-aligner; and measuring the physical property of the substrate in the pre-aligner.

3. The method according to claim 1, further comprising:
sending the measured physical property of the substrate to a gap-reducing controller associated with the substrate table;
loading the substrate into a space defined by an inner edge of a surface of the substrate table; and
reducing the gap between the edge of the substrate and the edge of the surface of the substrate table using the gap-reducing controller based on the measured physical property of the substrate.

4. The method according to claim 1, further comprising measuring the physical property of the substrate by detecting an outer edge of the substrate in order to determine a cross-sectional dimension of the substrate.

5. The method according to claim 1, further comprising measuring the physical property of the substrate by detecting a position of an outer edge of the substrate relative to a certain position.

6. The method according to claim 1, further comprising measuring the physical property of the substrate by measuring a shape of the substrate.

7. The method according to claim 1, further comprising measuring the physical property of the substrate by measuring a range of distances from the center of the substrate to the edge of the substrate.

8. The method according to claim 1, comprising:
loading the substrate into a space defined by an inner edge of a surface of the substrate table;
measuring the physical property while the substrate is loaded in the space; and
reducing a gap between the edge of the substrate and the edge of the surface of the substrate table, based on the measurement.

9. The method according to claim 1, wherein reducing the gap comprises positioning the substrate with respect to the edge of the surface of the substrate table such that the gap between the edge of the substrate and the edge of the surface of the substrate table is minimized.

10. The method according to claim 1, further comprising clamping the edge member into place once the edge member has been manipulated.

11. The method according to claim 1, wherein positioning the edge member comprises reducing its inner cross-sectional dimension to a size substantially the same as a cross-sectional dimension of the substrate.

12. The method according to claim 1, wherein the edge member is compressible and positioning the edge member comprises compressing the edge member in such a way that a cross-sectional dimension of the edge member is reduced.

13. The method according to claim 1, wherein the edge member and positioning the edge member each comprise at least one of the following:
the edge member comprises a plurality of arc-shaped segments and positioning the edge member comprises moving the plurality of arc-shaped segments toward each other to reduce a distance between the center of the edge member and the edge of the edge member;
the edge member comprises a substantially rigid ring and positioning the edge member comprises moving the edge member in the same plane as the substrate eccentrically such that a gap between a portion of the edge member and a portion of the substrate varies over time;
the edge member comprises an arc-shaped segment and positioning the edge member comprises moving the segment around the periphery of the substrate such that a section of the substrate edge adjacent which the segment is positioned varies over time;
the edge member comprises an incomplete ring with two ends defining an opening in the ring, the opening being configured to decrease in length as the edge member is compressed to decrease a cross-sectional dimension of the edge member;
wherein a portion of the edge member is made of a compressible material and positioning the edge member comprises compressing the portion peripherally, thus reducing the cross-sectional dimension of the edge member; or
the edge member comprises an incomplete ring shape with two ends in its periphery, the ends being configured to overlap while the edge member is compressed to reduce the cross-sectional dimension of the edge member.

14. A method of reducing a gap between a substrate and a substrate table, in an immersion lithographic apparatus, to support the substrate, the method comprising:
loading the substrate into a space defined by an inner edge of a surface of the substrate table;
measuring a gap between an edge of the substrate and the inner edge of the surface of the substrate table, using a sensor device in or on the substrate table; and
reducing the gap based on the measurement.

15. A device manufacturing method comprising:
loading a substrate onto a pre-aligner;
measuring a physical property of the substrate at the pre-aligner;
loading the substrate from the pre-aligner onto the substrate table;
reducing a gap at and between a convex edge of a substantial part of the substrate and an edge of a surface of the substrate table based on the measured physical property by positioning of an edge member in the gap, the convex edge curving outwards in a plane coplanar with a surface of the substrate onto which radiation is exposed; and
exposing the surface of the substrate with patterned radiation.

16. The method according to claim 15, wherein the edge member and positioning the edge member each comprise at least one of the following:
the edge member comprises a plurality of arc-shaped segments and positioning the edge member comprises moving the plurality of arc-shaped segments toward each other to reduce a distance between the center of the edge member and the edge of the edge member;
the edge member comprises a substantially rigid ring and positioning the edge member comprises moving the edge member in the same plane as the substrate eccentrically such that a gap between a portion of the edge member and a portion of the substrate varies over time;
the edge member comprises an arc-shaped segment and positioning the edge member comprises moving the segment around the periphery of the substrate such that a section of the substrate edge adjacent which the segment is positioned varies over time;
the edge member comprises an incomplete ring with two ends defining an opening in the ring, the opening being configured to decrease in length as the edge member is compressed to decrease a cross-sectional dimension of the edge member;
wherein a portion of the edge member is made of a compressible material and positioning the edge member comprises compressing the portion peripherally, thus reducing the cross-sectional dimension of the edge member; or the edge member comprises an incomplete ring shape with two ends in its periphery, the ends being configured to overlap while the edge member is compressed to reduce the cross-sectional dimension of the edge member.

17. The method according to claim 15, wherein positioning the edge member comprises reducing its inner cross-sectional dimension to a size substantially the same as a cross-sectional dimension of the substrate.

18. A device manufacturing method comprising:
supporting a substrate on a substrate table in a space defined by an edge of a surface of the substrate table so as to define a gap at and between the edge of the surface of the substrate table and a convex edge of a substantial part of the substrate, the convex edge curving outwards in a plane coplanar with a surface of the substrate onto which radiation is exposed;
measuring a size of the gap;
reducing the size of the gap by positioning of an edge member in the gap, the size of the gap being reduced based on the measured size of the gap; and
exposing the surface of the substrate with patterned radiation.

19. The method according to claim 18, wherein the edge member and positioning the edge member each comprise at least one of the following:
the edge member comprises a plurality of arc-shaped segments and positioning the edge member comprises moving the plurality of arc-shaped segments toward each other to reduce a distance between the center of the edge member and the edge of the edge member;
the edge member comprises a substantially rigid ring and positioning the edge member comprises moving the edge member in the same plane as the substrate eccentrically such that a gap between a portion of the edge member and a portion of the substrate varies over time;
the edge member comprises an arc-shaped segment and positioning the edge member comprises moving the segment around the periphery of the substrate such that a section of the substrate edge adjacent which the segment is positioned varies over time;
the edge member comprises an incomplete ring with two ends defining an opening in the ring, the opening being configured to decrease in length as the edge member is compressed to decrease a cross-sectional dimension of the edge member;
wherein a portion of the edge member is made of a compressible material and positioning the edge member comprises compressing the portion peripherally, thus reducing the cross-sectional dimension of the edge member; or
the edge member comprises an incomplete ring shape with two ends in its periphery, the ends being configured to overlap while the edge member is compressed to reduce the cross-sectional dimension of the edge member.

20. The method according to claim 18, wherein positioning the edge member comprises reducing its inner cross-sectional dimension to a size substantially the same as a cross-sectional dimension of the substrate.

* * * * *